(12) United States Patent
Gollewski et al.

(10) Patent No.: US 7,555,062 B2
(45) Date of Patent: Jun. 30, 2009

(54) METHOD AND DEVICE FOR DELAY-SENSITIVE MEASUREMENT OF A SIGNAL

(75) Inventors: Torsten Gollewski, Lenting (DE); Robert Lange, Lennestadt (DE); Thorsten Ringbeck, Siegen (DE); Holger Heβ, Siegen (DE); Bernd Buxbaum, Westerburg (DE)

(73) Assignee: PMD Technologies GmbH, Siegen (DE)

( * ) Notice: Subject to any disclaimer, the term of this patent is extended or adjusted under 35 U.S.C. 154(b) by 624 days.

(21) Appl. No.: 11/220,122

(22) Filed: Sep. 6, 2005

(65) Prior Publication Data

US 2006/0056544 A1    Mar. 16, 2006

(30) Foreign Application Priority Data

Sep. 13, 2004    (DE) .................... 10 2004 044 581

(51) Int. Cl.
H03K 9/00    (2006.01)
H04L 27/00   (2006.01)
H04B 1/38    (2006.01)

(52) U.S. Cl. .................... 375/316; 375/320; 375/219; 455/73

(58) Field of Classification Search ................. 375/316, 375/219; 455/73
See application file for complete search history.

(56) References Cited

U.S. PATENT DOCUMENTS 4,931,648 A * 6/1990 Elliott et al. ............. 250/370.1
2002/0181518 A1* 12/2002 Mizutani .................... 372/27
2004/0257478 A1* 12/2004 Su ............................ 348/731
2006/0255791 A1* 11/2006 Messing et al. .............. 324/98
2006/0293786 A1* 12/2006 Baba et al. ................. 700/245

FOREIGN PATENT DOCUMENTS

DE    19902612    7/2000
DE    10039422    2/2002
WO    WO 0214814    2/2002

* cited by examiner

Primary Examiner—David C Payne
Assistant Examiner—Brian J Stevens
(74) Attorney, Agent, or Firm—Paul & Paul (57) ABSTRACT

A method and device for detecting the amplitude and/or the phase position of an intensity-modulated signal, including the following: detecting an instant value of the intensity-modulated signal and of a first reference signal with a frequency differing from the intensity-modulated signal; mixing the first reference signal with the intensity-modulated signal to obtain a mixed-signal value; detecting an instant value of a second reference signal with a frequency differing from both the previously detected signals and of a third reference signal of the same frequency but phase-shifted from the second reference signal; mixing the mixed-signal value with the second reference signal to yield a first measurement value; mixing the mixed-signal value with the third reference signal to yield a second measurement signal value; and calculating the amplitude and/or phase position from the two measurement signal values.

5 Claims, 3 Drawing Sheets

METHOD AND DEVICE FOR DELAY-SENSITIVE MEASUREMENT OF A SIGNAL

BACKGROUND OF THE INVENTION

The present application relates to a method for detecting the amplitude and/or phase position of an at least partly intensity-modulated signal, and a device for carrying out the method.

Phase- or delay-sensitive mixer device elements for distance measurement are known from the state of the art. Such elements are described for example in German patent applications DE 196 35 932 and DE 197 04 496 as so-called Photogate Photomixing Devices (PG-PMD) for electromagnetic radiation. As an alternative to the PG-PMD elements the mixer device elements can for example also be designed as MSM-PMD elements (MSM: metal-semiconductor-metal), such as are disclosed in WO 02/33922 A2.

A feature common to the mixer device elements known from the state of the art is that they have read-out electrodes between which a photoconductive material, in particular a semiconductor material, extends. Additionally two or more transparent modulation gates can be provided on the semiconductor material.

If the photoconductive part of the device element is lit by intensity-modulated electromagnetic radiation, preferably in the visible or infrared spectral range, the conductivity of the device element between the read-out electrodes changes, depending on the intensity impinging on the detector at the time. If amplitude-modulated current or voltage signals which are inverted relative to one another or phase-shifted by 180° are simultaneously applied to the modulation dates (in the case of PG-PMD elements) or also directly to the read-out electrodes (in the case of MSM-PMD elements), mixed signals are received at the read-out electrodes and modulated by the differential frequency between the frequency of the intensity modulation of the incident radiation and the reference frequency. The output signals at the read-out electrodes of the mixer elements also depend on the intensity of the radiation occurring. If the two output signals of the read-out electrodes are added together, a signal dependent on the intensity of the radiation occurring is obtained, containing merely the direct components (DC). On the other hand the differential signal between the two output signals of the read-out electrodes contains merely the correlated signal components. Therefore the differential signal also carries both the phase and also the amplitude information of the incident intensity-modulated radiation.

The described method is also called push-pull detection or "balanced detection", as the modulation or read-out electrodes of the mixer element are connected by signals inverted relative to one another or phase-shifted by 180°. The push-pull method makes it possible to suppress the direct components and the asymmetries of the mixed structure intensity-modulated radiation by forming the difference between the two output signals of the mixer device, as described previously, and take account of only those signals which are correlated.

Since the amplitude and phase of the signal are unknown variables during measurements, at least two measurements with different phase positions of the reference signals are needed to measure the amplitude and phase of the measurement signal after the difference formation, depending on the modulation signal of the radiation impinging on the mixer and of the reference signal.

In the detectors known from the start of the art the two measurements are carried out either using a space-division multiplex method or using a time-division multiplex method.

In the space-division multiplex method a detector or picture element has two mixer devices. The two mixer device elements can be either arranged discretely one next to each other or also be an integrated component, e.g. form read-out electrodes arranged in crossover-style pairs. The decisive feature is that the reference signals of every detector element are push-pull-modulated while they are phase-shifted, ideally by 90°, relative to the reference signals of the respective second detector element. In this way two correlation functions of the signal to be measured can be measured and phase and amplitude evaluated. In the case of the space-division multiplex, approximately double the surface area of a single mixer element is needed for each picture element in order to be able to evaluate two autocorrelation functions simultaneously.

In the case of time-division multiplex the autocorrelation functions of the signal are measured in chronological succession, the reference signals of the mixer elements being phase-shifted relative to each other between two related measurements. The time-division multiplex method therefore requires twice as much measurement time as the space-division multiplex method. This is a disadvantage in particular for applications in which the measurement time plays a significant role. If for example distances in road traffic are to be detected, then short measurement times are essential if a driver or an autonomous system is to be given sufficient reaction time for example to avoid an obstruction.

On the other hand the object of the present invention is to provide a method and a device which make it possible to avoid the aforementioned disadvantages of the state of the art.

SUMMARY OF THE INVENTION

This object is achieved according to the invention by providing a method for detecting the amplitude and/or phase position of an at least partly intensity-modulated signal, which has the following steps:

i) Detecting an instant value of the at least partly intensity-modulated signal, ii) Detecting an instant value of a first reference signal, the first reference signal having a frequency which differs from the frequency of the intensity modulation, iii) Mixing the detected instant value of the at least partly intensity-modulated signal with the detected instant value of the first reference signal to obtain a mixed-signal value, iv) Detecting an instant value of a second reference signal, the second reference signal having a frequency which differs both from the frequency of the first reference signal and from the frequency of the intensity modulation, v) Detecting an instant value of a third reference signal, the third reference signal having the same frequency as the second reference signal, but being phase-shifted relative to the second reference signal, vi) Mixing the mixed-signal value with the detected instant value of the second reference signal to obtain a first measurement signal value, vii) Mixing the mixed-signal value with the detected instant value of the third reference signal to obtain a second measurement signal value, and viii) Calculating the amplitude and/or phase position of the at least partly intensity-modulated signal from the two measurement signal values.

The "intensity-modulated signal" can be both a purely electric signal, an electromagnetic signal, preferably in the visible or infrared spectral range, but also an ultrasound signal if corresponding detectors are used for the respective signal. For ultrasound signals, "intensity modulation" must be interpreted as amplitude modulation.

The reference signals can be electric or electromagnetic signals, but also ultrasound signals.

The term "frequencies" of the signals, used here and later, means that in the simplest case the signals are sinusoidal or cosinusoidal or modulated by a single frequency. However, any other periodic or quasi-periodic (e.g. random noise) modulations can also be used, so that "frequency" then means a complete set of discrete frequencies or frequency range. "Same frequency" is used here in the sense of temporal correlation between the signals.

The terms "phase" or "phase position" are generally used to describe a temporal signal lag, although, in the given examples, only the simplest case of a sinusoidal modulation is represented.

The principle of the present invention is based on the mixing of the mixed signal between the intensity-modulated signal and the first reference signal which carries the amplitude and phase position information of the intensity-modulated signal with a second and a third reference signal of known frequency, the frequency of the second and third reference signals differing from the frequency of the first reference signal and the frequency of the intensity-modulated signal. In this way two correlation functions are obtained from which amplitude and phase of the intensity-modulated signal can be calculated if the frequencies and phases of all signals are known.

The method according to the invention makes it possible to detect the amplitude and phase of an intensity-modulated signal with just a single measurement ("single-shot"). In this way the measurement time is reduced by a factor of two compared with the time-division multiplex and a substantial surface area on the chip is saved compared with the space-division multiplex, so that the fill factor of the chip is approximately doubled.

A version of the invention is preferred in which step iii) comprises the following steps:
 a) Mixing the detected instant value of the at least partly intensity-modulated signal with the detected instant value of the first reference signal to obtain at least a first interim value,
 b) Mixing the instant value of the at least partly intensity-modulated signal with the instant value, multiplied by −1, of the first reference signal to obtain at least a second interim value,
 c) Forming the difference between the first and second interim values to obtain the mixed-signal value.

The mixing of the intensity-modulated signal in push-pull operation, i.e. once with the first reference signal and once with a signal of identical frequency inverted relative to it, makes possible an advantageous difference formation between the two obtained interim signals to form the mixed signal. In this difference formation all direct components of the interim signals cancel each other out and the mixed signal contains only the correlated signal components. In this way there is an effective suppression of non-correlated background signals, e.g. due to the ambient light. However, all the asymmetries of the mixer which can result for example from the processing of a component are also balanced.

A version of the invention is particularly preferred in which steps i), ii) and iii) are carried out at the same time. In this way steps i), ii) and iii) are carried out in a particularly low-noise and effective manner. This can for example take place simultaneously in a single photomixing device of PG-MPD or MSM-PMD type.

It is particularly expedient if the instant value of the first reference signal and the instant value of the at least partly intensity-modulated signal are detected at the same time. If this detection takes place with the push-pull method, the time spent on measurement is reduced by a factor of two.

A version of the invention is particularly advantageous in which steps vi) and vii) are carried out at the same time. This simultaneous mixing of the mixed signal with the second and third reference signals makes possible a generation of the correlation signals which is parallel, unlike the serial time-division multiplex method, and therefore a substantial saving in measurement time. In this case the time spent on measurement is again reduced by a factor of two. A short time lag between steps vi) and vii), which is avoided in particular by using the same connection arrangement, is insignificant as long as the resulting relative phase displacement is known.

It is expedient if the instant value of the second reference signal and the instant value of the third reference signal are detected at the same time. In this way it is guaranteed that the two values have a fixed and known phase relation to each other.

It is advantageous if the frequency of the second reference signal is equal to the differential frequency between the frequency of the first reference signal and the frequency of the at least partly intensity-modulated signal. The thus-occurring so-called homodyne mixture in steps vi) and vii) makes it possible to obtain measurement signal values which are values of two autocorrelation functions of the mixed signal, so that the amplitude and the phase of the intensity-modulated signal can be calculated from these.

A version of the invention is particularly preferred in which a trigger signal is formed by mixing the first reference signal with a modulation signal which is proportional and phase-locked relative to the intensity-modulated signal, and the second reference signal is coupled phase-locked to the trigger signal. With the help of this coupling it is easily achieved that the phases and frequencies of all the signals are known and do not drift towards one another.

Moreover it is expedient if the sum of the first and the second interim signal values is formed. The summation signal contains only the direct components, but also takes account in particular of non-correlated or non-intensity-modulated background signals and makes it possible to give a measure of the total intensity impinging on the mixer.

If the phases of the second and third reference signals are phase-shifted by 90° relative to each other, values of the quadrature components perpendicular to one another of the correlation or autocorrelation functions are obtained as measurement signals.

Regarding the device, the object is achieved according to the invention by the provision of sources for a first, a second and a third reference signal, the frequency of the first reference signal being different from the frequency of the intensity modulation, and at least one mixer device element being provided, the mixer device element being provided for mixing the intensity-modulated signal with the first reference signal, and the device having two apparatuses for mixing the output signal of the mixer device element on the one hand with the second reference signal and on the other hand with the third reference signal, the second and the third reference signals being phase-shifted relative to each other.

The design according to the invention of a mixer device is advantageous since it makes possible to detect, without time-division and space-division multiplexing, two correlation functions of the signal emitted by the mixer device element and simultaneously measure the amplitude and phase of the intensity-modulated signal with a single measurement. There is no need for more than two read-out electrodes at the mixer device element, nor is it necessary, as in time-division multiplexing, to shift the phase positions of the first reference signal between the individual measurements of the correlation functions.

The parallel evaluation of the correlation functions makes possible a measurement which is quicker by a factor of two than the time-division multiplexing devices and an increase, again by a factor of two, in the fill factor of the detector chip compared with chips with space-division multiplex detectors.

It is expedient if the device additionally has a source for the intensity-modulated signal. If this signal is directed towards an object, reflected by this and detected by the mixer device element, the distance between the object and the mixer device element can be concluded from the phase position of the detected signal.

It is advantageous if the source for the intensity-modulated signal is a source for electromagnetic radiation, The preferred frequency range of the radiation lies in the visible or near-infrared range.

Although a device for detecting electromagnetic radiation is primarily covered by the following, the claimed device can also be used with a mixer device element for ultrasonic waves.

A version of the invention is preferred in which the mixer device element is a photomixing device, preferably a PG-PMD element or an MSM-PMD element. A MSM-PMD element such as can be used in the present invention has two read-out electrodes with a photoconductive semiconductor material lying between them. The two read-out electrodes are conductively connected to the photoconductive material. The intensity-modulated radiation impinges on the photoconductive layer, while the read-out electrodes are modulated by the first electric reference signal. The charge carriers created in the photoconductive layer are moved in the electric field of the two read-out electrodes. The created current or the voltage fluctuations created at the read-out electrodes then depend on the product of the conductivity of the photoconductive layer and the applied reference voltage. Therefore a current or voltage signal can be tapped at the read-out electrodes which depends on the intensity of the incident electromagnetic radiation and the phase difference between the intensity modulation and the first reference signal. Such a photomixing device can however also have a more complex structure, as is described e.g. in DE 198 21 974 A1. Thus additional transparent modulation gates to which the reference voltage can be applied can be provided above the photoconductive layer while the read-out electrodes are used merely to measure the current or voltage modulation, i.e. the mixed signal. Such PMD elements with additional modulation gates are called PG-PMD elements. Arrangements can also be used in which additional storage gates and storage structures are provided, such as disclosed in German patent application DE 10 2004 016 624. The form of the electrodes depends on the specific application and above all on the photoconductive material used, e.g. the semiconductors silicon or gallium arsenide. They can be in point or strip form (MSM) or also have any other geometric shape. In principle, all mixer device elements known from the state of the art can be used for the device according to the invention.

A version of the invention is particularly preferred in which an apparatus, preferably a difference amplifier, is provided for the formation of the differential signal between the output signals of the two read-out electrodes. The differential signal of the output signals of the mixer device element contains only correlated signal components.

If apparatuses are also provided to form the sum between the output signals of the mixer, this summation signal depends only on the non-correlated direct components of the mixed signal and therefore on the intensity of the non-modulated ambient signals. The thus-obtained summation signal can then be evaluated in signal-processing apparatuses, for example an integrator.

In a particularly preferred version of the invention the second and the third reference signals are phase-shifted by 90° relative to one another. In this way the even and odd correlation functions from which the phase and amplitude of the intensity-modulated signal can be measured with particularly great precision are obtained in the outputs of the mixers.

It is expedient if the frequency of the second and third reference signals is equal to the differential frequency between the frequency of the intensity modulation of the intensity-modulated signal and the first referential signal, the second and third reference signals being coupled phase-locked to this differential frequency. In this way two autocorrelation signals are obtained in the output of the two mixers. The phase of the intensity-modulated signal can be calculated from these.

A version of the invention is particularly preferred in which the differential signal between the two output signals of the mixer device element is processed with the help of a so-called IQ mixer. Such IQ mixers are commercially available as digital or analog components. The abbreviation IQ stands for "in-phase quadrature" which indicates that the input signal into the mixer is mixed with a second reference signal which is phase-shifted by 90° relative to another third reference signal. To increase the measuring precision of the phase the mixers 12 and 13 can be designed, like the mixer device element present in the device, as a push-pull mixer.

In an alternative version of the version, two separated difference amplifiers are provided instead of an IQ mixer or two discrete mixer elements, which, parallel to each other, form the difference between the two output signals of the mixer device element. If these difference amplifiers are connected at their supply or power connection to a modulated signal, this signal is immediately mixed with the differential signal between the output signals of the mixer device element. If, as before, two second and third reference signals, phase-shifted one relative to the other, are applied to the difference amplifiers, the signals corresponding to the correlation functions are again obtained in the output of the difference amplifiers.

A version of the invention is particularly preferred in which an analog-digital converter is provided in signal direction behind the at least one difference amplifier or also behind the two mixing apparatuses, so that the further signal processing can take place digitally.

It is expedient if the integration time of the sample-hold link before the analog-digital converter is equal to the reciprocal or an integer multiple of the reciprocal of the frequency of the second reference signal.

In a particularly preferred version of the invention at least one part of the elements of the device is integrated on a chip. It is particularly expedient if the mixer device element, the difference and summation amplifier and an analog-digital converter are integrated behind the difference amplifier on the chip. In this way a digital signal can be taken away for further processing, in particular for mixing with the second and third reference signals. Additionally, several mixer device elements with their downstream components can be integrated on a chip to form a detector array. Each mixer device element forms a picture element of an image-detection chip for detecting a three-dimensional image. It is expedient if the chip embodies CMOS technology.

In an alternative version of the invention it is expedient if in each case one or more mixer device elements are respectively integrated with two downstream difference amplifiers on the chip, so that the quadrature signals can already be taken away in analog or also digital form from the image detection chip.

In a particularly preferred version of the invention the read-out electrodes of the mixer device element are connected to apparatuses for eliminating undesired charge carriers, in particular those generated by outside light, from the mixer device element. Thus the common mode signal, essentially generated by unmodulated outside light, can be substantially suppressed, i.e. in particular into the linear dynamic range, while the push-pull wanted signal is barely impaired. These elimination apparatuses are periodically operable.

In this way the signal integration which takes place in the mixer device element is interrupted at regular intervals. The accumulated charge carriers then discharge, so that the integration process can begin anew. In this way overflow of the mixer device elements is prevented.

To keep the disruption due to the resetting of the mixer device element to the remaining apparatus as small as possible, it is expedient to reset the two read-out electrodes or the integrating elements of the mixer device simultaneously at intervals which correspond to an integer multiple of the period length of the output signal of the mixer device. It is moreover advantageous if the resetting takes place in a zero crossing of the oscillation of the mixed signal.

To additionally minimize the disruptive effects on the remaining circuit due to resetting it is advantageous if the read-out electrodes are wired with devices for uncoupling the mixer device element from the remainder of the circuit. These decoupling devices are operable essentially synchronously to the resetting devices and uncouple the mixer device from the remaining circuit whenever the mixer device is reset. The uncoupling devices are arranged in signal direction behind the elimination devices. It is particularly expedient if the recoupling of the mixer device element, i.e. the start of the two following integration times, takes place immediately after the resetting and still during the zero crossing of the mixed signal. The integration times of the mixer element should preferably be an integer multiple of the reciprocal of the frequency of the mixed signal and additionally have a hold time before the next resetting.

The devices for eliminating the charge carriers and uncoupling the mixer device element can be simple switches or, in a preferred version, metal oxide semiconductor field-effect transistors (MOS-FETs).

BRIEF DESCRIPTION OF THE DRAWINGS

Further advantages, features and application possibilities of the present invention become clear from the following description of a preferred version and the figures associated therewith.

DETAILED DESCRIPTION OF THE INVENTION

Figure 1:
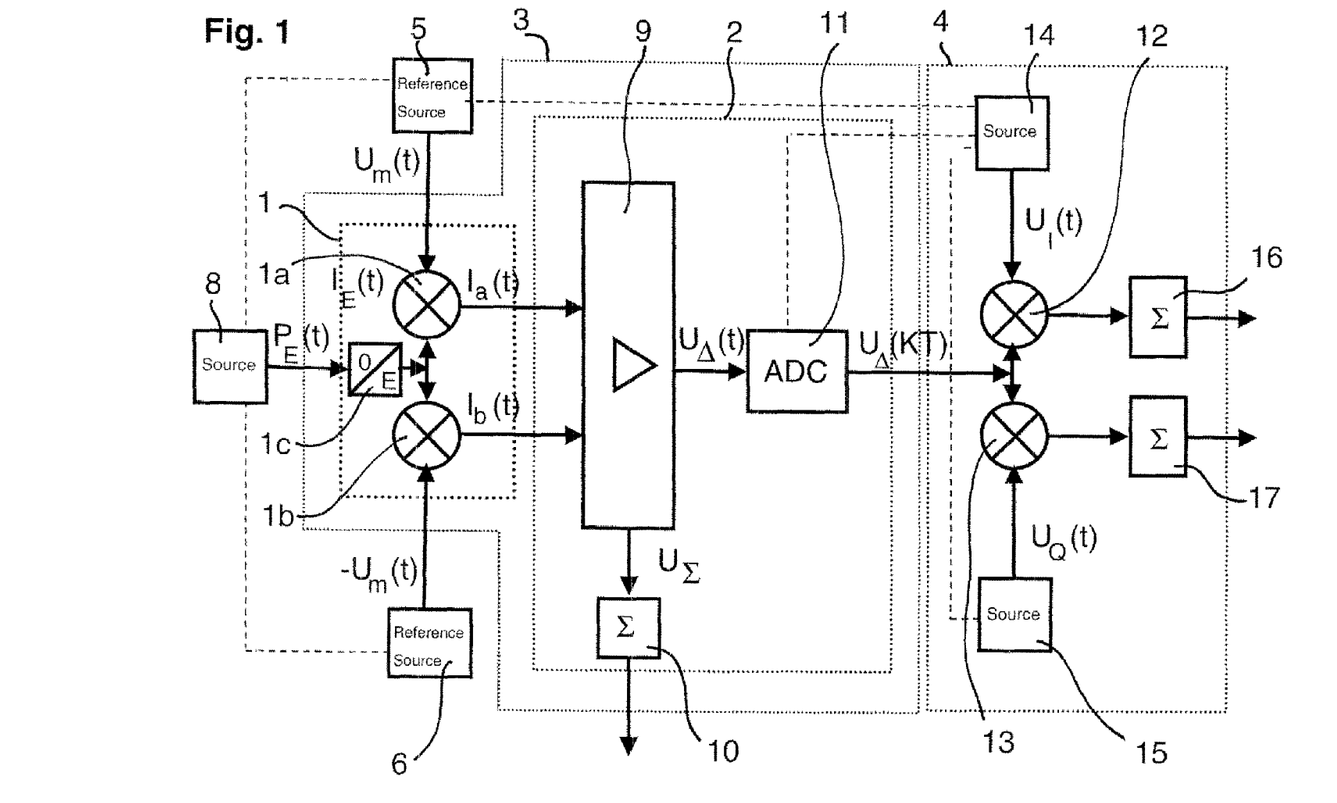
FIG. 1 shows schematically a first version of the device according to the invention for implementing the method according to the invention.

A schematic view of a preferred version of the present invention is represented in FIG. 1. With reference to the figure, both a preferred version of the device according to the invention and the mode of operation of the method according to the invention are described in the following.

The device has the photomixing element 1 which is designed as a PMD element, and the read-out circuit 2. The PMD mixer element 1, the read-out circuit 2 including an analog-digital converter 11 are integrated on a single chip 3. A digital IQ mixer circuit 4 is located outside the chip 3.

Alternatively the IQ mixer circuit 4 could also be designed in the form of an analog circuit and likewise be integrated on the chip 3 together with the other modules 1,2.

The represented MSM-PMD mixer element 1 of two read-out electrodes conductively connected to a photoconductive semiconductor layer lying between them. The PMD mixer element 1 is wired for push-pull operation. For better understanding of the detection process, the PMD mixer element 1 is represented as an equivalent circuit with two separate mixers 1a, 1b and a detector 1c for the incident electromagnetic radiation. In the detector 1c, the incident electromagnetic radiation $P_E(t)$ is converted into a current signal $I_E(t)=S\,P_E(t)$, S being the sensitivity of the mixer device element.

The equivalent circuit makes it particularly clear that two reference signals, inverted relative to each other, are present at the two read-out electrodes of the PMD mixer element and, for correlated signals, mixed signals likewise inverted relative to each other can be tapped at the two read-out electrodes of the PMD mixer element 1.

Non-correlated signals $P_E(t)$ and $\pm U_m(t)$ always result, in the sum or in the integration over a minimum time of the longest relevant signal period of $P_E(t)$ or $\Delta U_m(t)$ or an integer multiple of the same, in identical average values for $1_a(t)$ and $1_b(t)$.

Correlated signals $P_E(t)$ and $\pm U_m(t)$ always result, in the sum or in the integration over a minimum time of the longest relevant signal period of $P_E(t)$ or $\Delta U_m(t)$ or an integer multiple of the same, in identical push-pull values for $1_a(t)$ and $1_b(t)$.

One of the read-out electrodes of the PMD mixer element 1 is impacted by a first reference voltage $U_m(t)$. On the other hand a reference signal $-U_m(t)$ inverted thereto applies at the second read-out electrode of the PMD mixer element 1. The frequencies or angular frequencies $\omega_2$ of the two reference signals $U_m(t)$ and $-U_m(t)$ are identical. The reference signals can be any periodic or quasi-periodic signals, it being assumed hereafter for the sake of simplicity that both reference signals are cosine signals of the form $U_m(t)=\cos\omega_2 \cdot t$.

An intensity-modulated optical radiation signal $P_E(t)$ of the form $A\cdot\sin(\omega_1 t-\Phi)$ impinges on the photoconductive semiconductor layer of the PMD photomixer 1. A is the amplitude of the optical radiation signal, $\omega_1$ its frequency and $\Phi$ the phase position of the signal. The electromagnetic input signal $P_E(t)$ is converted into a current signal $1_E(t)$ in the photomixing device.

The modulation frequency of the intensity modulation of the incident electromagnetic radiation is 20 MHz in the represented version.

For this the frequencies of the reference signals $U_m$ and $-U_m$ are then shifted by 50 KHz, and are thus 20.05 MHz.

The electromagnetic input signal $P_E(t)$ or its current signal $1_E(t)$ is mixed in the PMD mixer element 1 with the reference signal $U_m(t)$ in push-pull operation. In this way two signals $1_a(t)$ and $1_b(t)$, inverted relative to one another, are obtained on the read-out electrodes of the PMD mixer element 1, with $1_a(t)\sim A\sin(\Delta\omega t-\Phi)$ and $1_b(t)\sim A-\sin(\Delta\omega t-\Phi)$. $\Delta\omega$ is the difference between the angular frequencies $\omega_1$ and $\omega_2$ of the optical radiation signal $P_E(t)$ or the electric reference signal $U_m(t)$.

The output signals $1_a(t)$, $1_b(t)$ of the PMD mixer element 1 are read out with the help of the read-out circuit 2. The read-out circuit 2 essentially consists of a difference and summation amplifier 9, an integrator 10 and an analog-digital converter 11. Both the difference $1_a(t)-1_b(t)$ between the output signals of the PMD mixer 1 and also the sum $1_a(t)+1_b(t)$ are formed with the help of the difference and summation amplifier 9. The summation signal UΣ depends on the non-correlated signal components of the electromagnetic current impinging on the PMG element, so that the summation signal, integrated in the following integrator 10, is a measure of the intensity of the non-modulated radiation which strikes the detector.

The output signal $U_A(t)$ of the difference amplifier is a voltage signal which depends on the term $A \sin(\Delta\omega t-\Phi)$. It contains the information about both the amplitude A of the modulated radiation signal and its phase position $\Phi$.

In the represented version of the invention the differential signal $U_A(t)$ is converted into a digital signal $U_A(KT)$ with the help of an analog-digital converter 11 which is likewise located on the chip 3. The clock frequency of the sample-hold link of the analog-digital converter 11 corresponds to the frequency $\Delta f = \Delta\omega/2\pi$ of the mixed signal between the optical radiation signal $P_E(t)$ and the first reference signal $U_m(t)$. The digitized output signal $U_A(KT)$ is led away from the chip into a digital IQ mixer circuit 4. In alternative versions the analog-digital converter 11 can however be dispensed with, so that the IQ mixer circuit 4 can also be of analog type.

The digitized differential signal $U_A$ is now led parallel to two discrete mixers. There they are each mixed with a second or third reference signal $U_1(t)$ or $U_Q(t)$. The second and third reference signals $U_1(t)$, $U_Q(t)$ created by the sources 14 and 15 have the same angular frequency $\Delta\omega$ as the mixed signal between the intensity-modulated radiation signal $P_E(t)$ and the first reference signal $U_m(t)$.

The reference signals $U_1(t)$ and $U_Q(t)$ are moreover coupled phase-locked to the mixed signal $U_A(t)$, which is indicated by the dotted-line connection between the sources 14 and 15 or 5, 6, 8. To achieve this coupling the first reference signal is additionally mixed with the signal driving the modulator of the source 8. The thus-created trigger signal also has the angular frequency $\Delta\omega$ and has a fixed phase relation to the mixed signal $U_A(t)$. The sources 13, 14 for the second and third reference signals are now coupled phase-locked to the trigger signal, the coupling to $U_A(t)$ occurring simultaneously.

The second reference signal $U_1(t)$ is also called in-phase signal, wherein its absolute phase position in relation to the differential signal $U_A(KT)$ may be chosen arbitrarily. The third reference signal $U_Q(t)$ is called quadrature signal and is phase-shifted by 90° relative to the second reference signal $U_1(t)$. Therefore the second and third reference signals $U_1(t)$, $U_Q(t)$ can also be called sine and cosine signals. The output signals of the two mixer elements 12, 13 depend, since a homodyne mixture is involved, on the sine or cosine of the phase position $\Phi$ of the optical radiation signal $P_E(t)$. The output signals of the mixers 12, 13 therefore correspond to the even (sine) and odd (cosine) autocorrelation functions. The phase position $\Phi$ of the optical radiation signal $P_E(t)$ can be calculated from these two functions as arctan $$\frac{\sin - \phi}{\cos - \phi}.$$

The summation linkers 16, 17 make it possible to sum-up the output signals of the mixer elements 12, 13, the summation having to take place in each case over a time interval which corresponds to the reciprocal $$T_\Delta = \frac{1}{\Delta f}$$

of the clock frequency of the sample-hold link of the analog-digital converter 11.

Figure 2:
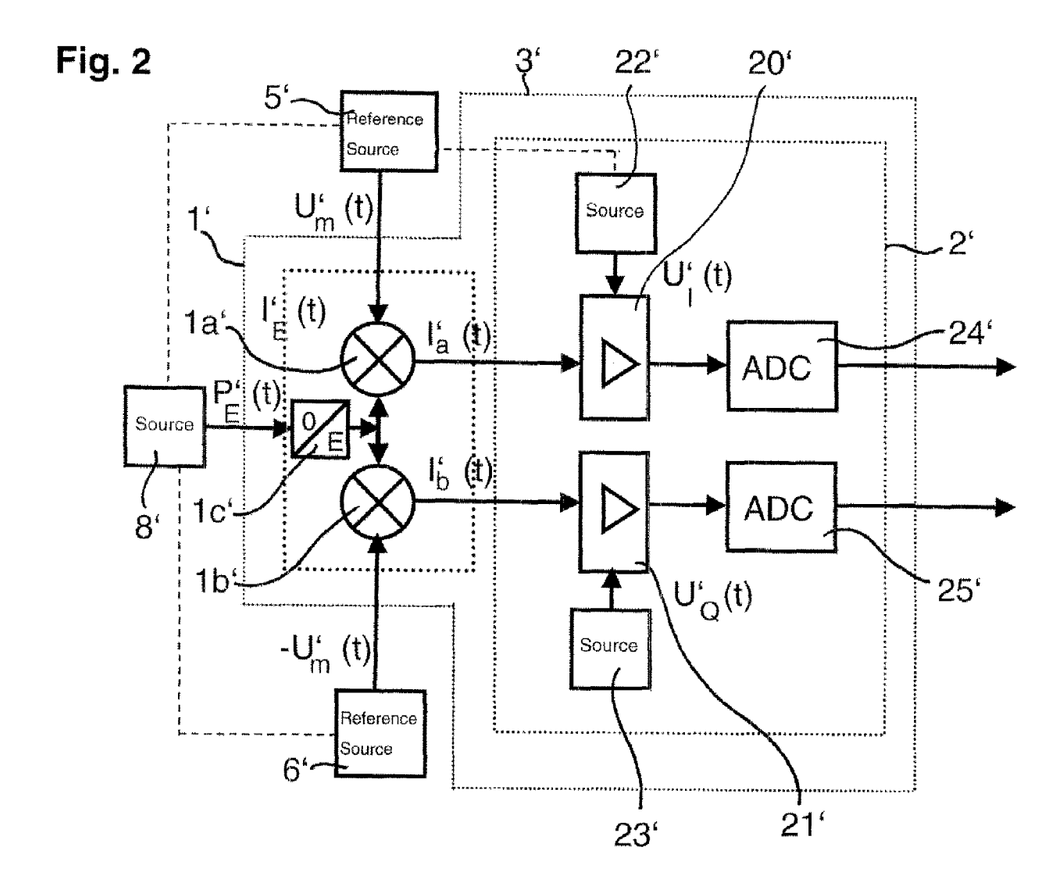
FIG. 2 shows schematically an alternative version of the device according to the invention for implementing the method according to the invention.

Another version of the present invention is schematically represented in FIG. 2. The MSM-PMD mixer element 1' and the source 8' of the modulated electromagnetic radiation $P_E(t)$ and also the sources 5' and 6' for the reference signal $U_m(t)$, $-U_m(t)$ are identical to those of FIG. 2. The two read-out electrodes of the PMD element 1' are however each connected to two parallel-connected difference amplifiers 20', 21' in the read-out circuit 2'. Moreover, the two read-out electrodes of the PMD element 1' are connected to a summation amplifier to form the sum of the two signals on the read-out electrodes. This summation amplifier is not represented, however, for the sake of simplicity.

The difference between the two signals $1_a(t)$ and $1_b(t)$ of the read-out electrodes of the PMD element 1' is formed in the difference amplifiers 20' and 21'. The power connections are impinged by a second or third reference signal $U_1(t)$ or $U_Q(t)$. These signals are created by sources 22' or 23', these being identical to the sources 14, 15 in the version represented in FIG. 1. The frequencies of the reference signals $U_1(t)$ and $U_Q(t)$ are equal to the differential frequency between the frequency of the intensity modulation of the electromagnetic radiation $P'_E(t)$ impinging on the PMD element and the frequency of the first reference signal $U'_m(t)$. Moreover, the sources 22', 23' are phase-locked on the signal of this frequency.

Due to the non-linear properties of the difference amplifiers 20', 21' not only is the differential signal $U'_A$ formed in the difference amplifiers, but the differential signal is simultaneously mixed with the reference frequencies $U_1(t)$ or $U_Q(t)$. Therefore the quadrature components of the signal or the odd and even autocorrelation functions are immediately obtained in the outputs of the difference amplifiers 20', 21'. The signals behind the two difference amplifiers 20', 21' correspond to the signals behind the mixers 12, 13 of the version represented in FIG. 1. Since the quadrature signals are present in analog form in FIG. 2, an analog-digital converter 24' or 25' is arranged behind the difference amplifiers 20', 21' so that the quadrature signals can be taken in digital form from the chip 3' for further processing.

The PMD elements 1, 1' and read-out circuits 2, 2' represented in FIGS. 1 and 2 represent segments from a two-dimensional array for image detection. Each PMD element 1, 1' is assigned a read-out circuit 2, 2' and two further mixers. The elements lying inside the dotted border 3' are each integrated on the image-detection chip, so that this emits digital signals for further signal and image processing.

Figure 3:
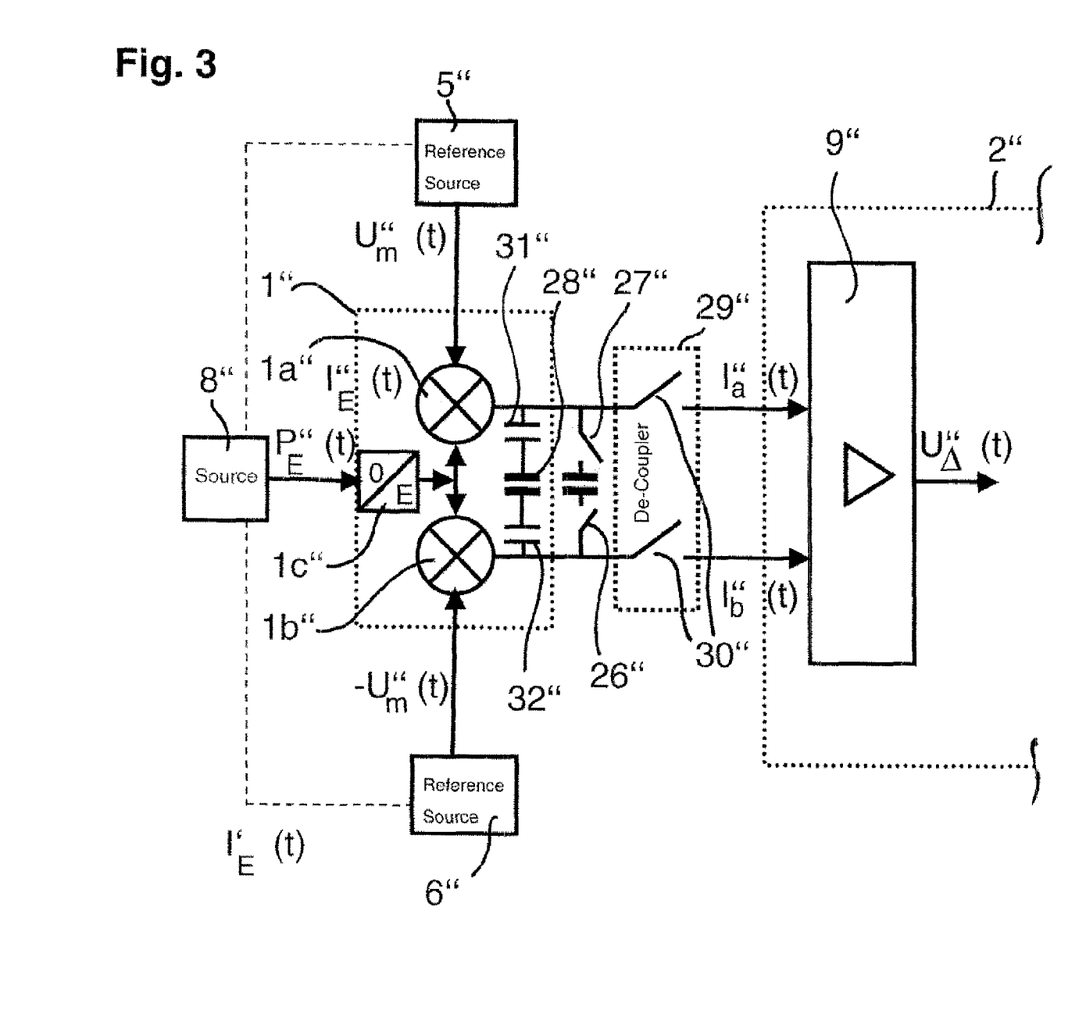
FIG. 3 shows schematically a third version of the device according to the invention.

An alternative version of the invention is represented in FIG. 3, with only the PMD mixer element 1'', the sources 5'', 6'' and 8'' for the intensity-modulated radiation signal $P''_E(t)$ and the first reference signal $U''_m(t)$ and the difference amplifier 9'' being represented for a better overview. To this extent the represented device is structurally identical to the version shown in FIG. 1. The PMD mixer element is a PG-PMD element, and thus, compared with the MSM-PMD elements from FIGS. 1 and 2, has two additional modulation gates which are wired in push-pull operation to the first reference signal instead of the read-out electrodes. The PG-PMD element shows additional scatter capacitances 31'' or 32'' which bring about an integration of the generated mixed signals.

The device shown therefore has, compared with the versions represented in FIGS. 1 and 2, additional apparatuses for eliminating the charges accumulated on the PMD mixer element and for uncoupling the PMD mixer element 1'' from the remaining circuit arrangement.

The elements for eliminating the charge carriers accumulated on the PMD element 1'' consist of two switches 26'', 27'', which when closed make possible a direct discharge of the charge carriers from the PMD mixer element via the read-out electrodes of the element to earth 28''. The elements 26'', 27'' schematically represented as switches are realized as MOSFET transistors. The switches are simultaneously periodically operated so that after a predetermined integration interval the PMD element 1'' is reset and all the charge carrier accumulations can discharge. This is advantageous, since in this way overflowing of the element 1'' is prevented. The integration interval between two reset processes is exactly an integral plurality of the modulation frequency of the signals $I_a(t)$ or $I_b(t)$.

In order to prevent interference of this periodic resetting of the PMD element 1'' on the downstream read-out circuit 9'' and thus on the mixed signal $U''_A(t)$ an apparatus 29'' for uncoupling the PMD element 1'' from the read-out circuit 2'' is additionally provided. Thus the apparatus 29'' for uncoupling the PMD element 1'' consists of two further MOSFETs which are schematically represented as switches 30''. In each case shortly before the resetting of the PMD element 1'' by closing the switching elements 26'', 27'', the PMD element 1'' is uncoupled from the following read-out circuit with the help of the switches 30'', so that the resetting does not produce any interference with the following circuit 2''. In the version represented the periodicity with which the PMD element 1'' is uncoupled from the following read-out circuit 3'' is equal to an integer multiple of the periodicity of the mixed signals $I''_a(t)$, $I''_b(t)$. In order to further minimize the interference the PMD element 1'' is again coupled into the read-out circuit precisely during the zero crossing of the mixed signals $I''_a(t)$, $I''_b(t)$.

For purposes of original disclosure, it is pointed out that all the features as they are revealed to a person skilled in the art from the present description, the drawings and the claims, even if they were specifically described only in connection with certain further features, can be combined both individually and also in any desired combinations with others of the features or groups of features disclosed here, unless this has been expressly ruled out or technical conditions make such combinations impossible or meaningless. The comprehensive explicit representation of all the conceivable combinations of features is dispensed with here only for the sake of brevity and readability of the description.

LIST OF REFERENCE NUMBERS

| | |
|---|---|
| 1, 1', 1'' | Photomixer element |
| 1c, 1c', 1c'' | Components of the photomixer element |
| 1a, 1a', 1a'' | 1, 1', 1'' in the equivalent circuit Components of the photomixer element |
| 1b, 1b', 1b'' | 1, 1', 1'' in the equivalent circuit Components of the photomixer element |
| 2, 2', 2'' | 1, 1', 1'' in the equivalent circuit Read-out circuit |
| 3, 3' | Chip |
| 4 | Digital IQ mixer element |
| 5, 6; 5', 6', 5'', 6'' | Reference signal sources |
| 8, 8', 8'' | Source of the modulated electrical radiation |
| 9, 9'' | Differential and summation amplifier |
| 10 | Integrator |
| 11 | Analog-digital converter |
| 12, 13 | Mixer elements |
| 14, 15 | Sources |
| 16, 17 | Summation linkers |
| 20', 21' | Parallel-connected difference amplifiers |
| 22', 23' | Sources |
| 24', 25' | Analog-digital converters |
| 26'', 27'' | Switches |
| 28'' | Earth |
| 29'' | Device for uncoupling the PMD element from the read-out circuit |
| 30'' | Switch |
| 31'', 32'' | Scatter capacitances |

The invention claimed is:

1. Method for detecting the amplitude and/or phase position of an at least partly intensity-modulated signal ($P_E(t)$), in a photonic ranging device, comprises the steps:
   i) Detecting an instant value of the at least partly intensity-modulated signal ($P_E(t)$),
   ii) Detecting an instant value of a first reference signal ($U_m(t)$), the first reference signal ($U_m(t)$) having a frequency ($\omega_2$) which differs from the frequency ($\omega_1$) of the intensity modulation,
   iii) Mixing the detected instant value of the at least partly intensity-modulated signal ($P_E(t)$) with the detected instant value of the first reference signal ($U_m(t)$) to obtain a mixed-signal value ($U_A$), by the steps of:
      a) Mixing the detected instant value of the at least partly intensity-modulated signal ($P_E(t)$) with the detected instant value of the first reference signal ($U_m(t)$) to obtain at least a first interim value ($1_a$),
      b) Mixing the instant value of the at least partly intensity-modulated signal ($P_E(t)$) with the instant value, multiplied by −1, of the first reference signal ($U_m(t)$ to obtain at least a second interim value,
      c) Forming the difference between the first and second interim values to obtain the mixed-signal value ($U_A$),
   iv) Detecting an instant value of a second reference signal ($U_I(t)$), the second reference signal ($U_I(t)$) having a frequency ($\Delta\omega$) which differs both from the frequency ($\omega_2$) of the first reference signal and from the frequency ($\omega_1$) of the intensity modulation,
   v) Detecting an instant value of a third reference signal ($U_Q(t)$), the third reference signal having the same frequency ($\Delta\omega$) as the second reference signal, but being phase-shifted relative to the second reference signal ($U_I(t)$),
   vi) Mixing the mixed-signal value ($U_A$) with the detected instant value of the second reference signal ($U_I(t)$) to obtain a first measurement signal value,
   vii) Mixing the mixed-signal value ($U_A$) with the detected instant value of the third reference signal ($U_Q(t)$) to obtain a second measurement signal value, and viii) Calculating the amplitude and/or phase position of the at least partly intensity-modulated signal ($P_E(t)$) from the two measurement signal values.

2. Method according to claim 1, characterized in that the sum of the first and second interim signal values is formed.

3. Method for detecting the amplitude and/or phase position of an at least partly intensity-modulated signal ($P_E(t)$) in respect to a photonic ranging device, comprising, the steps:
  i) Detecting an instant value of the at least partly intensity-modulated signal ($P_E(t)$),
  ii) Detecting an instant value of a first reference signal ($U_m(t)$), the first reference signal ($U_m(t)$) having a frequency ($\omega_2$) which differs from the frequency ($\omega_1$) of the intensity modulation,
  iii) Mixing the detected instant value of the at least partly intensity-modulated signal ($P_E(t)$) with the detected instant value of the first reference signal ($U_m(t)$) to obtain a mixed-signal value ($U_A$),
  iv) Detecting an instant value of a second reference signal ($U_I(t)$), the second reference signal ($U_I(t)$) having a frequency ($\Delta\omega$) which differs both from the frequency ($\omega_2$) of the first reference signal and from the frequency ($\omega_1$) of the intensity modulation,
  v) Detecting an instant value of a third reference signal ($U_Q(t)$), the third reference signal having the same frequency ($\Delta\omega$) as the second reference signal, but being phase-shifted relative to the second reference signal ($U_I(t)$),
  vi) Mixing the mixed-signal value ($U_A$) with the detected instant value of the second reference signal ($U_I(t)$) to obtain a first measurement signal value,
  vii) Mixing the mixed-signal value ($U_A$) with the detected instant value of the third reference signal ($U_Q(t)$) to obtain a second measurement signal value, and
  viii) Calculating the amplitude and/or phase position of the at least partly intensity-modulated signal ($P_E(t)$) from the two measurement signal values, characterized in that the frequency of the second reference signal is equal to the differential frequency between the frequency ($\omega_2$) of the first reference signal ($U_m(t)$) and the frequency ($\omega_1$) of the at least partly intensity-modulated signal ($P_E(t)$).

4. A device for performing a method for detecting the amplitude and/or phase position of an at least partly intensity-modulated signal ($P_E(t)$), which comprises the steps:
  i) Detecting an instant value of the at least partly intensity-modulated signal ($P_E(t)$),
  ii) Detecting an instant value of a first reference signal ($U_m(t)$), the first reference signal ($U_m(t)$) having a frequency ($\omega_2$) which differs from the frequency ($\omega_1$) of the intensity modulation,
  iii) Mixing the detected instant value of the at least partly intensity-modulated signal ($P_E(t)$) with the detected instant value of the first reference signal ($U_m(t)$) to obtain a mixed-signal value ($U_A$),
  iv) Detecting an instant value of a second reference signal ($U_I(t)$), the second reference signal ($U_I(t)$) having a frequency ($\Delta\omega$) which differs both from the frequency ($\omega_2$) of the first reference signal and from the frequency ($\omega_1$) of the intensity modulation,
  v) Detecting an instant value of a third reference signal ($U_Q(t)$), the third reference signal having the same frequency ($\Delta\omega$) as the second reference signal, but being phase-shifted relative to the second reference signal ($U_I(t)$),
  vi) Mixing the mixed-signal value ($U_A$) with the detected instant value of the second reference signal ($U_I(t)$) to obtain a first measurement signal value,
  vii) Mixing the mixed-signal value ($U_A$) with the detected instant value of the third reference signal ($U_Q(t)$) to obtain a second measurement signal value, and
  viii) Calculating the amplitude and/or phase position of the at least partly intensity-modulated signal ($P_E(t)$) from the two measurement signal values, comprising a source of an at least partly modulated high frequency signal ($P_E(t)$ and detection means for detecting an instant value of said an at least partly modulated high frequency signal ($P_E(t)$, wherein sources for a first, a second and a third reference signal are provided, the frequency of the first reference signal differing from the frequency of the intensity modulation, said second and third reference signals being phase-shifted relative to each other, and wherein means for detecting an instant value of said first, second and third reference signals and at least one mixer device element are provided, the mixer device element being provided for mixing the intensity-modulated signal with the first reference signal, and the device having two apparatuses for mixing the output signal of the mixer device element with the second reference signal and the third reference signal, for obtaining first and second measurement values, respectively, and including calculation means for calculating the amplitude and/or phase position of the at least partly intensity-modulated signal ($P_E(t)$) from the two measurement signal values, characterized in that the frequency of the second and third reference signals is equal to the differential frequency between the frequency of the intensity modulation of the radiation and the frequency of the first reference signal and in that the second and third reference signals are coupled in phase-locked relation to the differential frequency between the frequency of the intensity-modulated radiation and the frequency of the first reference signal.

5. A device for performing a method for detecting the amplitude and/or phase position of an at least partly intensity-modulated signal ($P_E(t)$), which comprises the steps:
  i) Detecting an instant value of the at least partly intensity-modulated signal ($P_E(t)$,
  ii) Detecting an instant value of a first reference signal ($U_m(t)$), the first reference signal ($U_m(t)$) having a frequency ($\omega_2$) which differs from the frequency ($\omega_1$) of the intensity modulation,
  iii) Mixing the detected instant value of the at least partly intensity-modulated signal ($P_E(t)$) with the detected instant value of the first reference signal ($U_m(t)$) to obtain a mixed-signal value ($U_A$),
  iv) Detecting an instant value of a second reference signal ($U_I(t)$), the second reference signal ($U_I(t)$) having a frequency ($\Delta\omega$) which differs both from the frequency ($\omega_2$) of the first reference signal and from the frequency ($\omega_1$) of the intensity modulation,
  v) Detecting an instant value of a third reference signal ($U_Q(t)$), the third reference signal having the same frequency ($\Delta\omega$) as the second reference signal, but being phase-shifted relative to the second reference signal ($U_I(t)$),
  vi) Mixing the mixed-signal value ($U_A$) with the detected instant value of the second reference signal ($U_I(t)$) to obtain a first measurement signal value,
  vii) Mixing the mixed-signal value ($U_A$) with the detected instant value of the third reference signal ($U_Q(t)$) to obtain a second measurement signal value, and
  viii) Calculating the amplitude and/or phase position of the at least partly intensity-modulated signal ($P_E(t)$) from the two measurement signal values, comprising a source of an at least partly modulated high frequency signal ($P_E(t)$ and detection means for detecting an instant value of said an at least partly modulated high frequency signal ($P_E(t)$), wherein sources for a first a second and a third reference signal are provided, the frequency of the first reference signal differing from the frequency of the intensity modulation, said second and third reference signals being phase-shifted relative to each other, and wherein means for detecting an instant value of said first, second and third reference signals and at least one mixer device element are provided, the mixer device element being provided for mixing the intensity-modulated signal with the first reference signal, and the device having two apparatuses for mixing the output signal of the mixer device element with the second reference signal and the third reference signal, for obtaining first and second measurement values, respectively, and including calculation means for calculating the amplitude and/or phase position of the at least partly intensity-modulated signal ($P_E(t)$) from the two measurement signal values, characterized in that the mixing apparatuses are at least two difference amplifiers, the supply connection of a first difference amplifier being modulated by the second reference frequency and the supply connection of a second difference amplifier being modulated by the third reference frequency.

* * * * *

UNITED STATES PATENT AND TRADEMARK OFFICE
CERTIFICATE OF CORRECTION

| | |
|---|---|
| PATENT NO. | : 7,555,062 B2 |
| APPLICATION NO. | : 11/220122 |
| DATED | : June 30, 2009 |
| INVENTOR(S) | : Gollewski et al. |

It is certified that error appears in the above-identified patent and that said Letters Patent is hereby corrected as shown below:

Column 8, line 16, insert --consists-- after "element 1" and before "of";

Column 12, line 31, replace "comprises" with --comprising--.

Signed and Sealed this

Twenty-fifth Day of August, 2009

David J. Kappos
*Director of the United States Patent and Trademark Office*